United States Patent [19]

Yoo et al.

[11] Patent Number: 5,487,952
[45] Date of Patent: Jan. 30, 1996

[54] SINTERED BI2TE3-BASED THERMOELECTRIC MATERIALS PREVENTING P- TO N-TYPE TRANSITION

[76] Inventors: Han-Ill Yoo, 329, Mokdong Apt. 1405-704, Sinjeong-Dong, Yangcheon-Ku, Seoul; Tae Ho Park, 527-3, Somang Villa 201, Wooman-Dong, Paldal-Ku, Suwon; Dae Suk Kang, Garamdongsan Apt. 13-505, Samcheon-Dong, Seo-Ku, Daejon; Beoung Doo Yoo, 1-38, Munhwa-Dong, Jung-Ku, Daejon, all of Rep. of Korea

[21] Appl. No.: 342,356

[22] Filed: Nov. 18, 1994

[30] Foreign Application Priority Data

Nov. 20, 1993 [KR] Rep. of Korea ............... 1993-24863

[51] Int. Cl.$^6$ ............... B22F 3/10; B22F 7/00
[52] U.S. Cl. ............... 428/552; 419/5; 419/7; 136/236.1; 136/240; 136/241; 136/238
[58] Field of Search ............... 419/5, 7; 428/552; 136/236.1, 240, 241, 238

[56] References Cited

U.S. PATENT DOCUMENTS

| | | | |
|---|---|---|---|
| 3,853,550 | 12/1974 | Nikolaev et al. | 75/213 |
| 4,029,520 | 6/1977 | Hampl, Jr. | 136/205 |
| 4,489,742 | 12/1984 | Moore et al. | 136/203 |
| 4,491,679 | 1/1985 | Moore | 136/203 |
| 4,665,276 | 5/1987 | Elbel et al. | 136/215 |
| 5,058,061 | 10/1991 | Koshino et al. | 365/106 |
| 5,108,515 | 4/1992 | Ohta et al. | 136/201 |
| 5,318,743 | 6/1994 | Tokiai et al. | 419/38 |

OTHER PUBLICATIONS

P. D. Delavignette, "Dislocation Nets in $Bi_2Te_3$ and $Sb_2Te_3$", *Phil. Mag.*, 5, 729–44 (1960).
W. R. George, "The Sintering of $Bi_2Te_3$", *Proc. Phys. Soc.*, 74, 768–770 (1959).
P. C. Eklund et al., "Thermoelectric Power Measurement Using Analog Substraction" *Rev. Sci Instrum.*, 48[7], 775–777 (1977).
T. C. Harman, "Special Techniques for Measurement of Thermoelectric Properties", *J. Appl. Phys.*, 29, 1373–1374 (1958).

*Primary Examiner*—Ngoclan Mai
*Assistant Examiner*—Scott T. Bluni
*Attorney, Agent, or Firm*—Scully, Scott, Murphy & Presser

[57] ABSTRACT

There are sintered $Bi_2Te_3$-based thermoelectric materials containing $Ag_2S$, which prevent p- to n-type transition of $Bi_2Te_3$-based thermoelectric materials during polycrystalline sintering and have improved thermoelectric properties.

4 Claims, 2 Drawing Sheets

SINTERED BI2TE3-BASED THERMOELECTRIC MATERIALS PREVENTING P- TO N-TYPE TRANSITION

BACKGROUND OF THE INVENTION

1. Field of the Invention

The present invention relates to sintered $Bi_2Te_3$-based thermoelectric materials containing $Ag_2S$ which prevent p- to n-type transition of $Bi_2Te_3$-based thermoelectric materials during polycrystalline sintering and have improved thermoelectric properties.

2. Description of the Prior Art

Thermoelectric materials based on $Bi_2Te_3$ have high figures-of-merit (Z) at room temperature ($Z \sim 1.5 \times 10^{-3}K$) and, thus, have been drawn much attention as one of the most promising thermoelectric materials for low temperature applications. The materials are usually employed in the form of a single crystal for thermoelectric devices. Single crystalline $Bi_2Te_3$, however, is extremely weak mechanically due to easy cleavage (P. D. Delavignette, "Dislocation nets in $Bi_2Te_3$ and $Sb_2Te_3$" Phil. Mag., 5, 729–744 (1960)) and is normally subject to difficulties with mass production. In order to circumvent these drawbacks associated with the $Bi_2Te_3$-based single crystalline material, attempts have been made to prepare polycrystalline $Bi_2Te_3$ via sintering. However, polycrystalline $Bi_2Te_3$-based materials go through p- to n-type transition during sintering (W. R. George, "The Sintering of $Bi_2Te_3$" Proc. Phys. Soc., 74, 768–770 (1959)). Such a change of electrical condition behavior from a p-type (holes) to an n-type (electrons) during processing causes thermoelectric power and conductivity of the material to be decreased. It is believed that p- to n-type transition occurs due to a defect of donors in sintering. One always ends up with n-type material after sintering even if started with p-type powder, which have prevented p-type thermoelectric material based on $Bi_2Te_3$ from being fabricated via the powder metallurgical technique. It is thus necessary to prevent, while maintaining the high figure-of-merit, the p-n transition of the $Bi_2Te_3$-based thermoelectric materials in sintering.

SUMMARY OF THE INVENTION

The object of the present invention is to provide $Bi_2Te_3$-based thermoelectric materials which prevent p- to n-type transition of a thermoelectric material in sintering, while keeping excellent thermoelectric properties.

DETAILED DESCRIPTION OF THE INVENTION

The basic composition of the thermoelectric material of the present invention is a $Bi_2Te_3$-based material, particularly quasi-binary 69% $Bi_2Te_3$-33% $Sb_2Te_3$, containing $Ag_2S$ up to 20 mol %. If the content of $Ag_2S$ is larger than 20 mol %, quantity of the second phase in the obtained sintered body after sintering the thermoelectric material increases and electric conductivity rapidly decreases.

For the preparation of the composition according to the present invention, the raw powders of Bi, Sb and Te are put into a quartz tube in an appropriate ratio. The tube is then evacuated and sealed to keep the raw materials from oxidation. The sealed tube is heated in order to melt the raw materials, rocked for homogeneous mixing, and cooled. The p-type ingot is crushed into particles of 45–75 μm size. To the obtained powder, $Ag_2S$ powder is added, and the mixture containing $Ag_2S$ is ball-milled for several hours and formed. In order to form the n-fixture, cold-pressing into pellets is possible. The formed mixture is sealed within a quartz tube and sintered at 500° C. for 5 hours.

Thermoelectric power (α) and thermal conductivity (κ) are measured to characterize the thermoelectric figure-of-merit, $Z(=\sigma\alpha^2/\kappa)$. Electric conductivity (σ) is measured by a D.C. 4 probe technique. Thermoelectric power is measured by a heat pulse technique (P. C. Eklund and A. K. Mabatah, "Thermoelectric Power Measurement Using Analog Substraction", Rev. Sci. Instrum., 48[7], 775–777 (1977)), and the thermal conductivity (κ) by a technique introduced by Harman (T. C. Harman, "Special Technique for Measurement of Thermoelectric Properties", J. Appl. Phys., 29, 1373–1374 (1958)).

Figure 1:
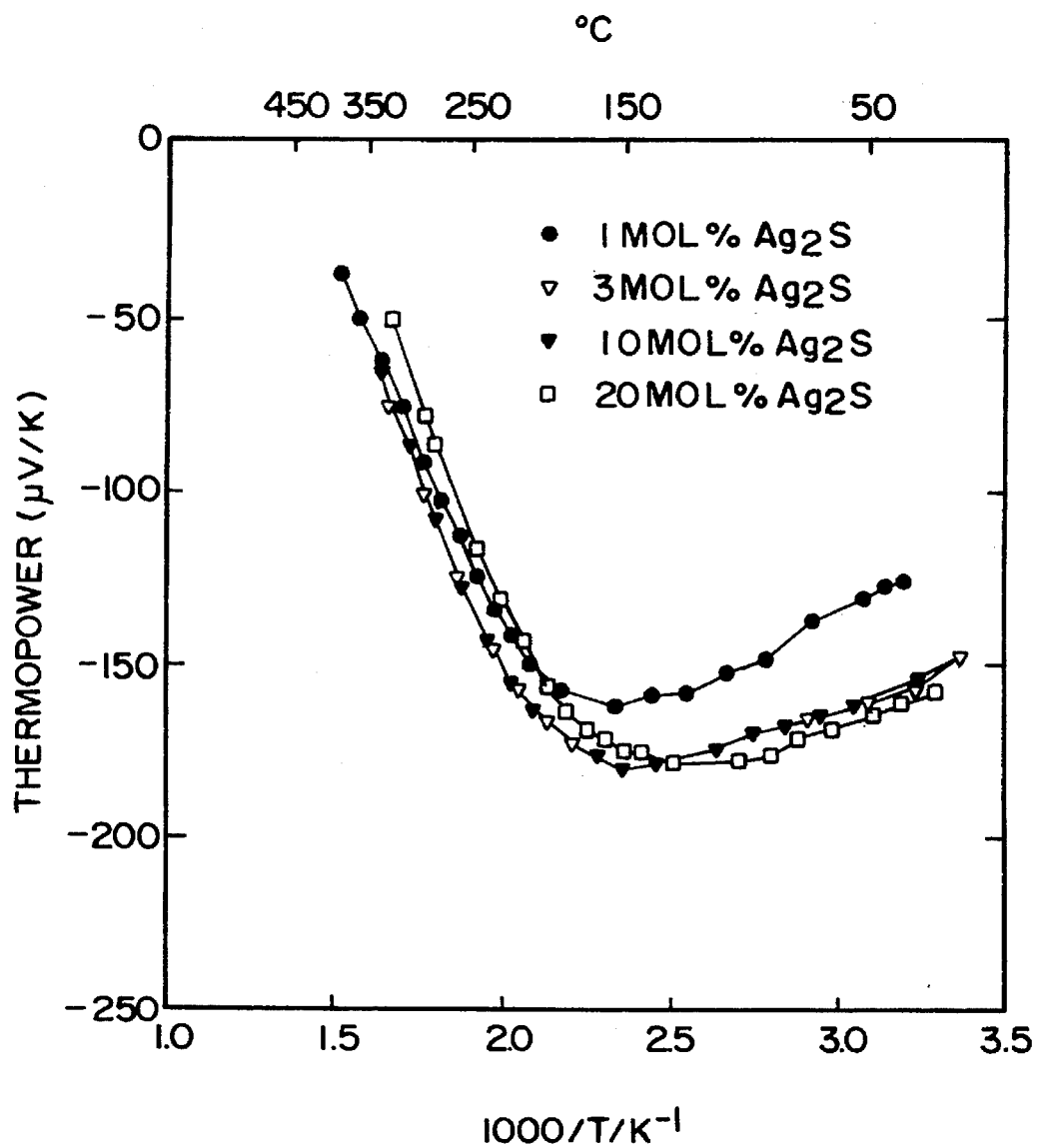
FIG. 1 shows thermoelectric power of sintered $Bi_2Te_3$-based thermoelectric materials of the present invention depending on the change of temperature and content of $Ag_2S$.

As shown in FIG. 1, it is clear that any of those systems containing $Ag_2S$ do not undertake a p-to-n transition. Thermoelectric power for the systems of sintered $Bi_{1.333}Sb_{0.667}Te_3$ in various contents of $Ag_2S$ are similar, but the specimen with 1 mol % $Ag_2S$ exhibits a little lower thermoelectric power. The thermoelectric powers of all the samples first increase with temperature up to ca. 150° C. and then decrease rather rapidly. The conductivities of the samples added with 3 mol % of $Ag_2S$ and 1 mol % of $Ag_2S$ are higher than the others. Thermoelectric power amounts to 120–160 μV/K at room temperature and the maximum is 160–180 μV/K.

Figure 2:
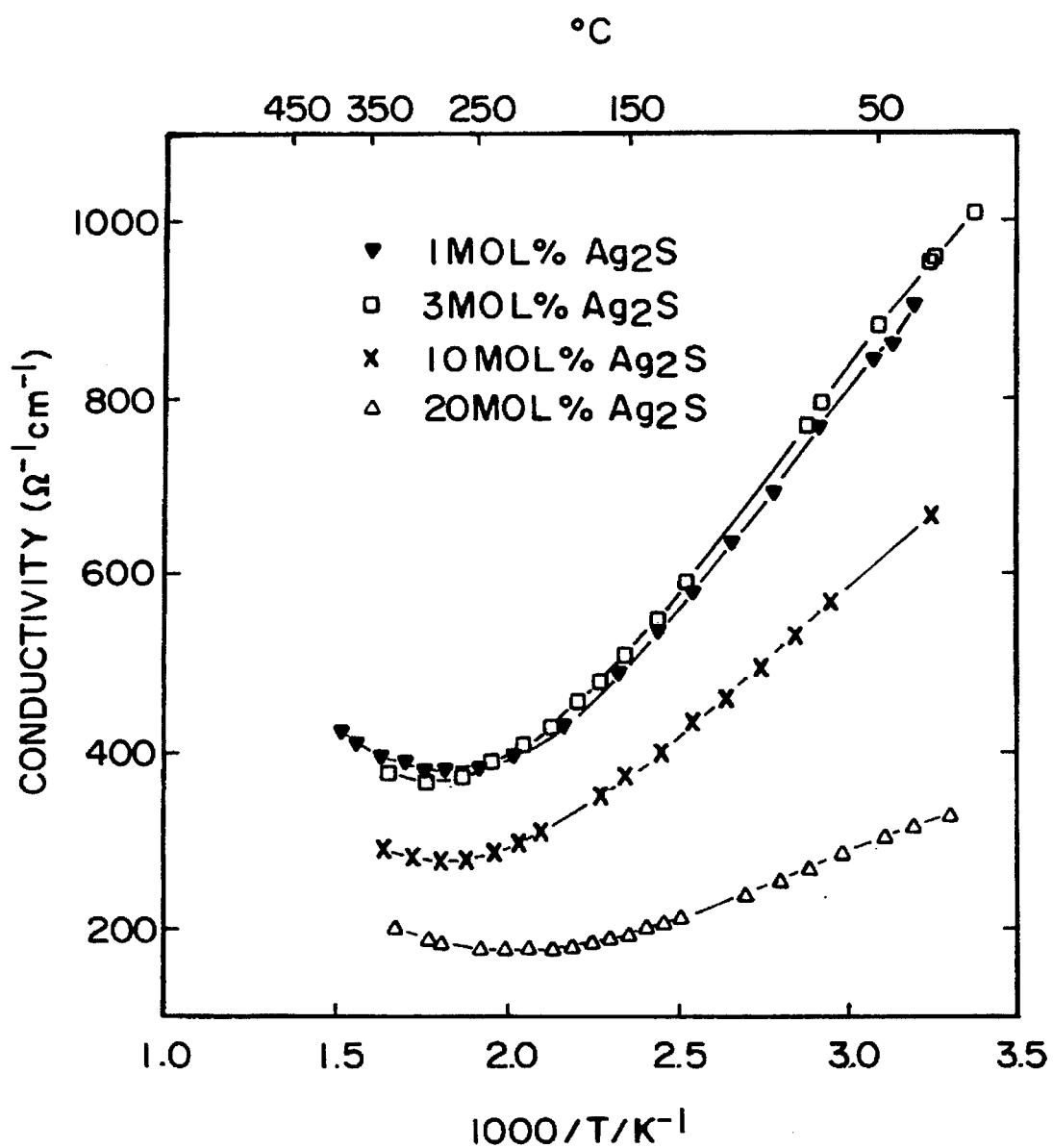
FIG. 2 shows the conductivity of sintered $Bi_2Te_3$-based thermoelectric materials of the present invention depending on the change of temperature and content of $Ag_2S$.

As shown in FIG. 2, the conductivities of all the samples decrease with increasing temperature and display a minimum at about 250° C. The conductivities of these samples are as high as about $1000\Omega^{-1}$ $cm^{-1}$ at room temperature.

Thermal conductivities of all the samples are about the same at room temperature in the range of $1.3–1.4\times10^{-2}$ W/Kcm.

The value for the figure-of-merit at room temperature is about $Z=1.8\times10^{-3}/K$ for the sample added with 3 mol % $Ag_2S$. It is as good as that of the single crystalline specimen.

EXAMPLE

The raw powders of Bi, Sb and Te in the purity of 99.999% were weighed to 69% $Bi_2Te_3$-33% $Sb_2Te_3$, and put into a quartz tube. The tube was evacuated and vacuum-sealed. The sealed tube was heated to 700° C., for 5 hours, rocked for homogeneous mixing, and cooled to room temperature. The p-type ingot was crushed into particles of 45–75 μm size. To the obtained powder, $Ag_2S$ powder of 1 mol %, 3 mol %, 10 mol % and 20 mol % was added, respectively. Each mixture containing $Ag_2S$ was homogenized with a ball-mill for 3 hours and cold-pressed into pellets. The pellets were sealed within a quartz tube and sintered at 500° C. for 5 hours.

Electric conductivity ($\sigma$), thermoelectric power ($\alpha$) and thermal conductivity ($\kappa$) were measured to characterize the thermoelectric figure of merit, $Z(=\sigma\alpha^2/\kappa)$.

What is claimed is:

1. A $Bi_2Te_3$-based thermoelectric material that contains $Ag_2S$, said $Ag_2S$ being present in an amount up to 20 mol % for preventing p- to n-type transition during sintering.

2. The material in accordance to claim 1, wherein the $Bi_2Te_3$-based thermoelectric material has the composition of $Bi_{1.333}Sb_{0.667}Te_3$.

3. A $Bi_2Te_3$-based thermoelectric material that contains $Ag_2S$, said $Ag_2S$ being present in an amount up to 20 mol % for preventing p- to n- type transition during sintering, which is prepared by:

mixing $Bi_2Te_3$-based thermoelectric material powder and $Ag_2S$ powder; and sintering the resulting mixture at a temperature of 500° C. for about 5 hours.

4. The material in accordance to claim 3, wherein the $Bi_2Te_3$-based thermoelectric material has the composition of $Bi_{1.333}Sb_{0.667}Te_3$.

* * * * *

UNITED STATES PATENT AND TRADEMARK OFFICE
CERTIFICATE OF CORRECTION

PATENT NO.  : 5,487,952
DATED       : January 30, 1996
INVENTOR(S) : Hans-Ill, et al.

It is certified that error appears in the above-indentified patent and that said Letters Patent is hereby corrected as shown below:

Column 2, line 12, "n-fixture" should read --mixture--

Signed and Sealed this

Seventeenth Day of September, 1996

*Attest:*

BRUCE LEHMAN

*Attesting Officer*  *Commissioner of Patents and Trademarks*